PHOTOPOLYMERIZABLE COMPOSITIONS

Filed Aug. 27, 1956

INVENTOR
ELMORE LOUIS MARTIN

BY Lynn Barratt Morris
ATTORNEY

United States Patent Office 2,927,023

Patented Mar. 1, 1960

2,927,023

PHOTOPOLYMERIZABLE COMPOSITIONS

Elmore Louis Martin, Wilmington, Del., assignor to E. I. du Pont de Nemours and Company, Wilmington, Del., a corporation of Delaware Application August 27, 1956, Serial No. 606,505

9 Claims. (Cl. 96—35)

Figure 1:
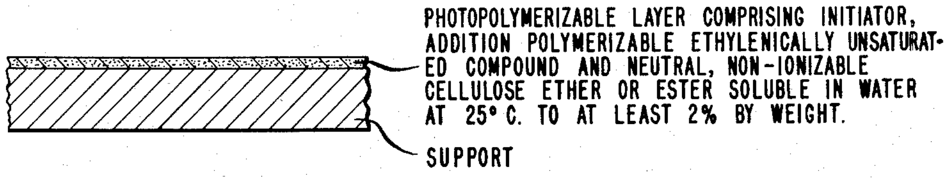

This invention relates to new polymeric compositions, and more particularly to certain water-soluble, photosensitive, addition polymerizable, ethylenically unsaturated, polymeric compositions. It also relates to photopolymerizable elements, e.g., plates embodying a layer of such compositions, to processes of making printing reliefs from such elements and to the resulting printing reliefs.

Solid compositions capable of polymerization under the influence of actinic light to rigid, insoluble, tough structures have recently become of increased technical importance, especially in the making of printing plates, as described and claimed in Belgian Patent 525,225, and British Patents 741,441 and 741,470, and in the copending application of Plambeck Ser. No. 326,841, filed December 19, 1952 (U.S. Patent 2,760,863). In the process of the latter application printing plates with uniform printing height are produced directly (*a*) by exposing to actinic light through an image-bearing process transparency a layer of an essentially transparent, addition polymerizable, ethylenically unsaturated composition, containing uniformly dispersed therethrough an addition polymerization initiator activatable by actinic light, said layer being superposed on and adherent to a suitable support, until substantial polymerization of the composition occurs in the exposed areas with substantially no polymerization occurring in the none-exposed areas and (*b*) by removing the layer in the latter areas, e.g., by treatment with a suitable solvent in which the polymerized composition in the exposed areas is insoluble. Such removal leaves a raised relief image corresponding to the transparent image of the transparency eminently suitable for direct use as a printing plate, especially for letterpress and dry offset work.

Such solid photopolmerizable layers have been prepared from solely organic solvent soluble polymeric components and accordingly with such compositions development of the printing plate after exposure requires the use of wholly organic solvents or solutions with high percentages of organic solvents. Due to the high volatility and generally low flash point of low cost organic solvents, undesirable hazards are thus encountered, particularly since the development step is carried out in the printing shop where the plates are made and where the proper equipment or experience for the handling of such chemicals is generally not available.

Some solid photopolymerizable layers which are water—and particularly aqueous alkali—developable are known, and offer advantages in development. These previous layers have utilized polymeric components containing lateral acid groups or the soluble salts thereof, or have utilized water-soluble polyamides. Among the former components are the high acid number alkyd resins described in Plambeck U.S. application Ser. No. 326,841 (U.S. Patent 2,760,863); the free oxyacid cellulose derivatives or salts thereof of the copending application of Barney and Martin Ser. No. 596,766, filed July 9, 1956; or the acid substituted polyvinyl alcohols or soluble salts thereof of the copending applications of Martin Ser. No. 604,006, filed Aug. 14, 1956. Photopolymerizable layers containing these various polymeric components, result in excellent printing reliefs when handled according to the process of the above Plambeck application.

An object of this invention is to provide photopolymerizable compositions and elements which can be used in place of those described in the previous paragraph for making reliefs and more particularly printing reliefs. Another object is to provide such compositions and layers in photopolymerizable elements that are soluble in water. Another object is to provide such compositions and elements which can be readily photopolymerized to addition polymers which are insoluble in aqueous solutions.

A further object is to provide such compositions that contain economical constituents which are readily soluble in the aforesaid solutions. A still further object is to provide photopolymerizable elements having layers of the aforesaid compositions which can be exposed and developed with simple aqueous processing solutions and thus obviate volatile solvent recovery problems and health hazards which are presented by the use of organic solvents as developing solutions. A still further object is to provide a printing relief which is hard, tough, non-tacky and has a long press life. Still other objects will be apparent from the following description.

A new class of solid, water-developable, photopolymerizable compositions has now been discovered which utilize neutral, non-ionizable (free from acid or salt groups) solid, water-soluble cellulose derivatives. These compositions which also contain an addition polymerizable ethylenically unsaturated component and an addition polymerization initiator are readily convertible to the film or layer form from solution, e.g., in water, or by conventional procedures, e.g., coating, extruding, calendering, or the like, with or without added plasticizers, and yet in solid layer form they are surprisingly not unduly water- or moisture-sensitive. After exposure through a process transparency the compositions are readily developable with water to form printing reliefs, thus obviating the need for organic solvents, although organic solvents can be used and frequently are used in minor proportions depending on the nature of the organic/aqueous partition solublity of the water-soluble component, which solublity variations are known in the art. The printing reliefs obtained in accordance with the invention have very good wear characteristics, comparable to copper-faced electrotypes, which are much more expensive and more difficult to prepare. Furthermore, these new compositions can contain relatively large proportions of addition polymerizable, ethylenically unsaturated, low molecular weight components without exhibiting any undesirable loss in physical properties or undue tackiness.

The new compositions of this invention comprise: (1) a small amount of an addition polymerizable initiator activatable by actinic light (commonly referred to as a photoinitiator); (2) an addition polymerizable, ethylenically unsaturated component, preferably having a plurality of such unsaturated linkages; and (3) a neutral, non-ionizable, water-soluble cellulose ester and/or ether. Components (2) and (3) consist of, respectively, from 10 to 60% and from 40 to 90% by weight of the total compositions exclusive of component (1). The latter is present in amounts of from 0.01 to 5.0% based on component (2).

This invention also includes elements suitable for the preparation of printing relief images comprising an adherent support having superposed thereon a solid layer of the just described photopolymerizable compositions of from 3 to 250 mils in thickness. In a preferred embodiment, these elements will comprise supports from which no more than 35% of the incident actinic light is reflected. When the support material is light-reflective, e.g., metal plates or foils which are outstanding because of inherent physical properties, there will be superposed on said support and adherent thereto a layer absorptive of actinic light so as to permit reflectance from the combined support of again no more than 35% of the incident actinic light. Similar photopolymerizable elements are described in detail and claimed in the copending application of Plambeck Ser. No. 541,723, filed October 20, 1955 (U.S. Patent 2,791,504).

The various components of the new compositions of this invention must be carefully selected. The solid cellulose ether and/or ester component, which can comprise one or more such derivatives, must be neutral, non-ionizable, and water-soluble to the extent of at least 2% by weight at room temperature. This latter requisite means that there can be present only very narrowly and precisely defined ranges of ester and/or ether substituents, said ranges having both maxima and minima, with the remainder of the glucose hydroxyls being present as such. These required ranges of ether and/or ester substitution vary with the nature and the size of the substituents, as is known in the art.

Cellulose is rendered water-soluble by destroying its highly crystalline nature and upsetting the compact interaction between the glucose hydroxyls of adjoining chains or groups. Once a finite degree of disruption is achieved, the hydroxyl groups so disrupted are no longer involved in interaction with other glucose hydroxyls and are free for solvation with water molecules and ultimate solubility in water. At the higher levels of disruption, the disordered hydroxyl groups are so much in the majority that interaction therebetween again becomes the controlling factor and the derivatives are no longer water-soluble.

The degree of ester or ether substitution necessary to achieve the desired disruption will vary with the size of the substituent, with the larger, i.e., bulkier, substituents requiring a lower order of substitution to achieve water-solubility. At the same time these larger substituents have a lower upper limit of substitution beyond which water-solubility cannot be achieved. This means that a linear ester or ether substituent must be present in greater quantities than a branched chain substituent to achieve water-solubility and furthermore that increasing carbon chain, whether straight or branched, requires lower orders of substitution to effect water-solubility.

Presumably, due to the greater size thereof, lower degrees of substitution are required and permitted with the ester substituents than with the corresponding ether substituents. Not only are the upper and lower permitted limits of substitution decreased with increasing chain length within a single functional type, but also the permitted range of substitution becomes narrower. Finally, with substituents of about the equivalent of a four-carbon straight chain or higher, the range has become so narrowed that substantially only one degree of substitution is permitted for each.

The preceding factors are well known in the cellulose art and form no part of the present invention. It is likewise known that mild concentrations of alkali in the solvent medium markedly change the permitted and required degrees of substitution for aqueous solubility, with the necessary values all being appreciably less. Dilute alkaline solutions can be used but no advantage is gained thereby and the preferred compositions are all water-soluble. The interrelationship of chain length and nature of the ether or ester substituent and the effect thereof on water-solubility and the concomitant effect of mild amounts of strong bases are well illustrated by the following table taken from page 1460 of "High Polymers," vol. V, Part III, "Cellulose and Cellulose Derivatives," edited by Ott, Spurlin and Grafflin, Interscience Publishers, New York, 1955.

SOLUBILITY OF HYDROPHYLIC CELLULOSE DERIVATIVES

| Derivative | Substitution Range for Good Solubility | |
|---|---|---|
| | 4-8% Aqueous NaOH | Water |
| Cellulose Acetate | ---------- | 0.6-0.9 |
| Methyl Cellulose | 0.1-0.4 | 1.3-2.6 |
| Ethyl Cellulose | 0.2-0.5 | 0.8-1.3 |
| Hydroxyethyl Cellulose | 0.17+ | 1.2-1.4+ |
| Isopropyl Cellulose | ---------- | 0.5 |
| Cyanoethyl Cellulose | ---------- | 0.7-1.0 |

In the above table, the last two entries were taken from pages 892 and 956 of vol. V, part II of the same treatise. The values in this table apparently are to be interpreted within the range of about plus or minus 0.05 which is the order of accuracy given to degree of substitution values in cellulose chemistry. Thus, Barkey et al, paper 12, page 5E, Abstracts of Papers, 129th Meeting American Chemical Society, Dallas, Texas, April 8–13, 1956, report that the water-soluble cellulose acetates range between 13 and 19% acetyl substitution. According to the data given at page 1424 of the Ott et al. treatise, these values of acetyl content correspond to an acetyl degree of substitution of 0.55 to 0.85. In the preferred water-soluble derivatives, there is present from 10 to 17% by weight of the respective substituents, exclusive of the linking oxygen.

These ranges are both narrow, as above, and quite critical. Thus, cellulose derivatives having degrees of ester and/or ether substitution above or below the values indicated above are not water-soluble. The ester and/or ether substituents are neutral, non-ionizable, and solely hydrocarbon other than ester, ether, and/or alcohol oxygen. The preferred substituents, other than the ester and/or ether oxygen linkages to the cellulose backbone, are solely saturated hydrocarbon and of no more than 7 carbons, and especially no more than 4 carbons, each.

The second component of the new compositions of this invention, the low molecular weight, addition polymerizable component, must likewise be carefully selected and can comprise one or more such compounds, preferably containing a plurality of addition polymerizable ethylenic linkages. This component must be present in only carefully selected concentrations ranging from 10 to 60%, and preferably from 20% to about 40% by weight of the whole composition.

Not only is the concentration of this component critical, but so is the chemical and physical nature thereof. In the first place since the new compositions should be substantially transparent to the utilized actinic light, although slight haze can be tolerated, the low molecular weight polymerizable components must be compatible with and preferably show some plasticizing action for the cellulose derivative. In general, the entire composition, including the photoinitiator, must exhibit an optical density to the actinic light of less than 0.5 per mil and less than 5.0 in photopolymerizable layer form.

The low molecular weight, addition polymerizable component must have a normal boiling point greater than 100° C. at atmospheric pressure. It can vary in molecular weight from about 100 to about 1500 but must contain at least one addition polymerizable ethylenic linkage for every about 300 units of molecular weight. The preferred low molecular weight addition polymerizable components are those of molecular weight 150 to about 500 containing at least one addition polymerizable ethylenic linkage for every 100–250 units of molecular weight.

The photoinitiator component, i.e., addition polymerization initiator activatable by actinic light, must also be chosen carefully, both as to identity and concentration. It must be soluble in the entire composition or capable of substantially uniform distribution therethrough. Many such compounds are known and any or all of them can be used singly or admixed in the present compositions. The photoinitiators are generally present in the compositions in amounts ranging from about 0.01% up to about 5.0%, with preferred quantities lying in the range of 0.1% to 2.0%, based on the polymerizable component.

Figure 2:
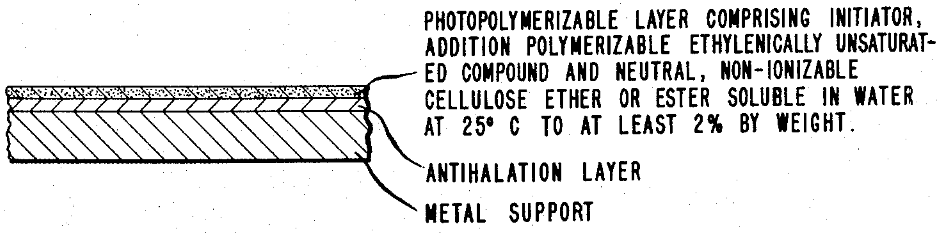

In the attached drawings which constitute a part of this application:

Fig. 1 is a vertical cross-sectional view of one type of photopolymerizable element of this invention, and Fig. 2 is a vertical cross-sectional view of an alternative photopolymerizable element.

This invention is illustrated in greater detail by the following examples in which parts are by weight. These examples include some prefered compositions and photopolymerizable elements prepared therefrom and their use in the preparation of printing plates.

*Example I*

To a solution of 3.5 parts of a commercial methyl cellulose (viscosity 25 centipoises in 2% water solution at 20° C.) in 35 parts of water there were added with stirring 0.05 part of benzoin methyl ether, 0.001 part of hydroquinone, and a solution of 1.5 parts of 1,3-bis(methylacrylamido)-2-propanol in about 4 parts of methanol. The resulting clear solution was cast about 60–80 mils thick on glass plates and the solvent allowed to evaporate at room temperature in subdued light. The resulting solid transparent 7 to 10-mil thick film of the methyl cellulose/bis-methacrylamide/initiator/stabilizer composition adhered tenaciously to the glass plate. A line process negative carrying a lettertext in clear areas on a dark background was placed on the upper surface of the dry, firm, photopolymerizable layer. The resulting assembly, including the glass plate, was placed on a black antihalation background and exposed for a period of 7.5 minutes while rotating on a turntable at about 4 r.p.m. to the light from four 275-watt mercury vapor sunlamps arrange at a distance of 12 to 14 inches. At the end of the exposure the negative was removed and the material in the unexposed and thus unchanged areas of the photopolymerizable layer under the dark areas of the negative was removed by washing in water at 25 to 30° C. for three minutes. There was thus obtained a mechanically strong, printable, scratch-resistant, raised relief image of the lettertext in the clear areas of the negative exhibiting excellent sharpness and fidelity with deep recess areas.

The 1,3-bis(methacrylamido)-2-propanol was prepared by the acylation, i.e., amidation, of 1,3-diamino-2-propanol with methacrylyl chloride in the presence of aqueous potassium carbonate at 0 to 5° C. and obtained as colorless crystals melting at 75 to 77° C after recrystallization from ethylene chloride/diethyl ether mixture.

*Analysis.*—Calc'd. for $C_{11}H_{18}O_2$: C, 58.4%; H, 8.0%; N, 12.4%. Found: C. 58.8%; H, 8.1%; N, 12.4%, 12.5%.

*Example II*

To a solution of 1.75 parts of cellulose acetate (D.S.=0.85, prepared by the hydrolysis of acetone-soluble cellulose acetate, as described in U.S. 2,129,052) in 15 parts of water there were added with stirring 0.02 part of benzoin methyl ether, 0.005 part of hydroquinone, and a solution of 0.75 part of bis-1,2(3-methacrylamidopropoxy)ethane in about four parts of ethanol. The resulting clear solution was cast on glass plates to form a cast layer 40 to 60 mils thick, and the solvents were allowed to evaporate at room temperature in subdued light. The resulting solid, transparent, firm, non-tacky 7 to 10-mil thick film of the cellulose acetate/bis-methacrylamide/initiator/stabilizer composition was exposed to a line process negative and developed in water, all as described in detail in Example I. There was thus obtained printing relief of the lettertext in the clear areas of the negative exhibiting excellent sharpness and fidelity, and with deep recess areas.

The bis-1,2(3-methacrylamidopropoxy)ethane was prepared by the acylation, i.e., amidation, of bis(1,3-diaminopropoxy)ethane with methacrylyl chloride at 0–5° C. in the presence of aqueous potassium carbonate and obtained as colorless crystals melting at 74–75° C. after recrystallization from methylene chloride/diethyl ether mixture.

*Analysis.*—Calc'd. for $C_{16}H_{28}O_4N_2$: C, 61.5%; H, 9.0%; N, 9.0%. Found: C, 61.5%; H, 9.0%; N, 8.9%, 9.0%.

As previously stated, the neutral, non-ionizable, water-soluble cellulose derivatives which are useful for preparing the new compositions of this invention are very narrowly and critically defined in terms of the maximum and minimum amounts of ester and/or ether substituents, which amounts vary with the nature of the chain of the substituents. The ester and/or ether substituents within the above defined limits are hydrocarbon other than ester, ether, and/or alcohol oxygen, and of no more than 7 carbon atoms. The preferred substituents are those which, except for the ester and/or ether linkages to the cellulose backbone, are solely saturated aliphatic hydrocarbon, especially those of no more than 4 carbon atoms each. Other than such substituents within the aforesaid limits, the cellulose is unsubstituted, i.e., the remaining cellulose hydroxyls are present in free hydroxyl form.

In general, the cellulose backbone is composed of at least 50 combined glucose units and preferably the cellulose DP (degree of polymerization) ranges from 75–100 up to 400–500, or higher, with values of from 100–300 being the most usual. It is within the purview of this invention to use cellulose ethers and/or esters within the aforesaid limits wherein the said substituents are hydrocarbon, hydrocarbonoxy, hydroxyhydrocarbon, and/or hydroxyhydrocarbonoxy ether and/or ester substituents. Specifically included are such water-soluble cellulose derivatives within all these limits wherein the hydrocarbon moieties are aliphatic, cycloaliphatic, araliphatic, alkaromatic, and the like. Especially useful because of better water-solubility are the aliphatic, hydroxyaliphatic, and the corresponding oxy-interrupted ethers and/or esters.

Suitable additional specific examples of these water-soluble cellulose derivatives include:

(1) cellulose acetate (D.S.=0.6);
(2) cellulose acetate/butyrate (acetate D.S.=0.6, butyrate D.S.=0.02);
(3) cellulose acetate/methacrylate (acetate D.S.=0.7, methacrylate D.S.=0.01);
(4) cellulose acetate/acrylate (acetate D.S.=0.8, acrylate D.S.=0.02);
(5) cellulose acetate/methoxyacetate (acetate D.S.=0.6, methoxyacetate D.S.=0.05);
(6) methyl cellulose (D.S.=2.0);
(7) methyl/ethyl cellulose (methyl D.S.=1.0, ethyl D.S.=0.3);
(8) methyl cellulose acetate (methyl D.S.=0.6, acetate D.S.=0.3);
(9) ethyl hydroxyethyl cellulose (ethyl D.S.=0.9, hydroxyethyl D.S.=0.9);
(10) hydroxyethyl cellulose (hydroxyethyl D.S.=1.3);
(11) methyl ethyl cellulose acetate (methyl D.S.=0.4, ethyl D.S.=0.4, acetate D.S.=0.2);
(12) ethyl cellulose acrylate (ethyl D.S.=1.0, acrylate D.S.=0.02);
(13) cellulose acetate/crotonate (acetate D.S.=0.7, crotonate D.S.=0.03);
(14) cellulose acetate/propionate (acetate D.S.=0.7, propionate D.S.=0.01);

(15) allyl cellulose acetate (allyl D.S.=0.2, acetate D.S.=0.6);
(16) allyl ethyl cellulose (allyl D.S.=0.05, ethyl D.S.=1.0);
(17) methoxyethyl cellulose acetate (methoxyethyl D.S.=0.05, acetate D.S.=0.65); and
(18) cyanoethyl cellulose (cyanoethyl D.S.=0.8), and cellulose acetate/heptanoate (acetate D.S.=6, heptanoate D.S.=0.03).

The preferred neutral, non-ionizable, water-soluble cellulose derivatives most useful in the new compositions of this invention are those within the above limits wherein the ester and/or ether substituents, other than the necessary ester and ether links are solely saturated hydrocarbons or no more than 4 chain carbons, e.g.

cellulose acetate (acetate D.S.=0.75);
cellulose acetate (acetate D.S.=0.85);
methyl cellulose (methyl D.S.=1.3);
ethyl cellulose (ethyl D.S.=1.0) and
isopropyl cellulose (isopropyl D.S.=0.5).

In the above defined groups, in terms of numbers of chain carbons, an aliphatic carbon is counted as a single unit in a chain, whereas a ring structure in a chain is counted as about two chain carbons rather than the total of all the ring atoms. A ring confers far less chain length character to these lateral ester and ether substituents than is indicated by the total number of ring members. Thus, a propionate and a benzoate are about equivalent carboxylic acid ester substituents. Since in neither instance are the functional carbons in the ester linkage counted in the said carbon chain, both side chain substituents have the equivalent of about two chain carbons. Similarly, a propyl ether and a phenyl ether are about equivalent ether substituents. One of the above defined neutral, non-ionizable, and water-soluble cellulose derivatives can be used or a mixture of two or more such ethers, or two or more such ether/esters, and the like, can be used.

These various substituted cellulose derivatives are known and can conveniently be made by known esterification or etherification reactions on cellulose or the low ethers or esters thereof—see, for instance, U.S. Patents 1,682,382, 2,069,974, and 2,093,462. The requisite degree of free cellulose hydroxyls in the case of the cellulose ethers is most conveniently obtained by controlling the initial degree of etherification. In the case of cellulose esters, the requisite hydroxyl content is most conveniently obtained by esterifying and post-hydrolyzing under controlled conditions, for instance, in the manner of U.S. Patent 2,129,052.

Like the above-described water-soluble cellulose derivatives, the low molecular weight addition polymerizable component of the new compositions of this invention is similarly narrowly and precisely selected and defined, both as to its nature and as to the quantity thereof which can be present in these new compositions. In the first place, there must be at least 10% of this addition polymerizable component which preferably carries a plurality of addition polymerizable ethylenic linkages. Compositions containing smaller quantities have been found either to insolubilize too slowly on light exposure or else not to insolubilize sufficiently to permit adequate and proper development of the printing relief image. On the other hand, compositions of this invention containing more than about 60% by weight of the composition of this low molecular weight addition polymerizable component are likewise unsatisfactory in that at these higher levels the low molecular weight, unsaturated, addition polymerizable component is either incompatible with the water-soluble cellulose derivative, or else, if compatible, due to the concomitant solubilizing or plasticizing action on the water-soluble cellulose derivative, the resulting compositions are soft and tacky and therefore only difficultly useable by normal handling techniques in the preparation of relief printing plates. Because of the more rapid insolubilization in shorter exposure times, it is desirable to include in the new compositions of this invention as much of this low molecular weight addition polymerizable component as is possible consonant with the achievement of the firm, non-tacky, solid layers desired for use in preparation of relief printing plates. Generally speaking, this addition polymerizable component will preferably be present in amounts of from 20 to 40% based on the composition as a whole.

This low molecular weight addition polymerizable component must also be critically selected in terms of its structure and properties. In the first place, this component must have a minimum boiling point of 100° C. at atmospheric pressure and furthermore must form with the water-soluble cellulose derivative a substantially homogeneous and transparent composition. Furthermore, the low molecular weight addition polymerizable component must be compatible with the water-soluble cellulose derivative and the photoinitiator and desirably exhibits plasticizing or solvent action for either or both, especially the former, particularly at elevated temperatures. In general, this addition polymerizable component will range from 100 to no greater than about 1500 in molecular weight since materials within this range exhibit the best plasticizing or solubilizing action for the water-soluble cellulose derivatives and accordingly permit fabrication of the desired layers of the new compositions of this invention by conventionally used extrusion or milling techniques. The polymerizable component should contain at least one polymerizable ethylenic linkage for every 300 units of molecular weight. The preferred polymerizable components range in molecular weight from about 150 to about 500 and have at least one polymerizable ethylenic linkage for each 100 to 250 units of molecular weight since such exhibit greater plasticizing action on the water-soluble cellulose derivative and on exposure polymerize more rapidly to somewhat more insoluble polymers. Desirably, this addition polymerizable component should have at least one terminal vinylidene group per molecule.

Suitable specific such components, in addition to those given in the examples, include selected esters of α-methylene carboxylic acids, e.g.

methyl methacrylate,
diethylene glycol acrylate,
N-(β-hydroxyethyl)methacryamide,
N,N-bis(β-hydroxyethyl)acrylamide,
β-acetamido-methacrylate and
β-methacrylamidoethyl propionate;

selected olefin blends with ethylenic α,β-dicarboxylic acid or esters thereof, e.g., styrene/diethyl fumarate, styrene/diethyl maleate blends; esters of vinylbenzoic acid, e.g., methyl vinylbenzoate and β-hydroxyethyl vinylbenzoate. The preferred such polymerizable components are the esteramides and the amides. These will also usually be used in part with the esters, the latter generally being in the minority.

Because of their more rapid rate of insolubilization on exposure, presumably due to a relatively rapid estblishment of a network polymer structure, an outstanding class of the low molecular weight addition polymerizable components are those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen, and sulfur. Particularly useful are such components wherein the ethylenically unsaturated groups, especially the vinylidene groups, are conjugated with ester or amide structures. The following compounds are further illustrative of this class: unsaturated esters of polyols, particularly such esters of the α-methylene carboxylic acids, e.g.

ethylene diacrylate,
diethylene glycol diacrylate,
glycerol diacrylate,
glycerol triacrylate,
ethylene dimethacrylate,
1,3-propylene dimethacrylate,
1,2,4-butane triol trimethacrylate,
1,4-cyclohexanediol diacrylate,
1,4-benzenediol dimethacryate,
pentaerythritol tetramethacrylate,
1,3-propylene glycol diacrylate,
1,5-pentanediol dimethacrylate and the bis-acrylates and methacryates of polyethylene glycols of molecular weight 200–500; unsaturated amides, particularly those of the α-methylene carboxylic acids, and especially those of alpha, omega-diamines, such as methylene bis-acrylamide,
methylene bis-methacrylamide,
ethylene bis-methacrylamide,
1,6-hexamethylene bis-acrylamide,
diethylene triamine tris-methacrylamide,
bis(γ-methacrylamidopropoxy)-ethane,
β-methacrylamido-ethyl methacrylate,
N(β-hydroxethyl)-β-(methacrylamido)ethyl acrylate, and
N,N-bis(β-methacrylyloxyethyl)acryl-amide;

vinyl esters, e.g., divinyl terephthalate, divinyl benzene-1,3-disulfonate and divinyl butane-1,4-disulfonate; unsaturated aldehydes, e.g., α-vinyl crotonaldehyde.

A particularly useful class of these preferred addition polymerizable components are the esters and amides of α-methylene carboxylic acids and substituted carboxylic acids with polyols and polyamines wherein the molecular chain between the hydroxyls and amino groups is solely carbon or oxygen-interrupted carbon. Because of the relatively high hydroxyl content of the polymeric component of these new compositions, the preferred low molecular weight polymerizable components, for reasons of superior compatibility therewith are the polymerizable components with strongly polar substituents, for instance, the polymerizable amides, esteramides, or those with hydroxy-substituents, or those immediately described above with oxy-interrupted carbon chains. As in the case of the monoethylenically unsaturated polymerizables, these latter polyunsaturated components will also be used in part with such esters components, the latter usually in the minority.

The ethylenically unsaturated, addition polymerizable compounds described in the preceding four paragraphs and in the examples and elsewhere throughout this application are normally non-gaseous compounds, that is, they are liquids or solids at normal temperatures and pressures. In addition, these compounds readily form addition polymers of high molecular weight by photoinitiated polymerization, i.e., in the presence of an addition polymerization initiator therefor activatable by actinic light.

In addition to the aforesaid components or mixtures thereof, the photopolymerizable layer can also contain added preformed compatible condensation or addition polymers as well as immiscible polymeric or non-polymeric, organic or inorganic fillers or reinforcing agents which are essentially transparent, e.g., the organophilic silicas, the bentonites, silica, and powdered glass, having a particle size less than 0.4 mil in their maximum dimension, and in amounts varying with the desired properties of the photopolymerizable layer up to 40% of the whole.

Suitable preformed compatible polymers are the addition polymers generally, including specifically vinyl ester polymers and copolymers, polyvinyl alcohol, polyvinyl acetate, polyvinyl butyrate, polyvinyl acetals, e.g., polyvinyl butyral and polyvinyl formal. Suitable compatible condentation polymers include both saturated and unsaturated types, such as the alkyd resins, e.g., polyglycerol phthalate and polyglycerol maleate. The addition polymers can also be unsaturated, e.g., polyvinyl alcohol esters of unsaturated acids and acetals of unsaturated aldehydes, e.g., polyvinyl sorbate and polyvinyl sorbal. The foregoing polymers, because of relatively low compatibility with the water-soluble cellulose components will generally be used in only relatively minor amounts.

Other compatible polymeric fillers which can be used in higher concentrations but still below the 40% limit include: the lower polymeric glycols and glycol ethers, e.g., the tri-, tetra-, and like polyethylene glycol ethers; the polyethylene oxides, especially the lower (1000–5000) molecular weight species; natural carbohydrate gums; gelatin, starch and dextrin; and polyvinyl alcohol.

These added substituents can be present in all the foregoing compositions in order to modify the rheological properties thereof, render the photopolymerizable layers even more tack-free, and make the compositions more readily formable into sheets. Since a stiff sheet can be more easily handled in many forming operations, e.g., in preparing a photopolymerizable plate for use in making a printing plate, the use of filler materials such as the foregoing giving the requisite stiffness has important commercial advantages. Mixtures of two, three or more of the foregoing compatible polymers and/or fillers can be used in the photopolymerizable compositions, but in general the fillers should not be present in amounts exceeding about 40% by weight of the whole composition. With polymeric fillers amounts up to about 20% by weight of the whole give the best results.

Inert, relatively non-volatile, liquid or semi-liquid plasticizers can be present and are particularly efficacious when the compositions per se are too stiff, or when relatively low amounts of the low molecular weight polymerizable component, e.g., 10–15% by weight of the whole, are present. Suitable specific examples of this latter class of compatible plasticizers include:

low molecular weight polyols, e.g., glycerol, triethylene glycol, tetraethylene glycol;
low molecular weight natural or easily derived natural products, e.g., sorbitol, sulfonated castor oil;
hydroxyamine salts, e.g., ethanolamine salts such as triethanolamine acetate;
organo/inorganic esters, e.g., triethyl phosphate;
long chain organo/inorganic acid salts, e.g., sodium dodecylsulfonate;
or sulfate;
N-substituted amides, e.g., the sulfonamides, such as N-ethyl-p-toluenesulfonamide.

As pointed out above, the water-soluble cellulose derivative and low molecular weight addition polymerizable component of the compositions of this invention must be carefully selected. The same is true for the necessary addition polymerization initiator. In the first place, the photoinitiator, i.e., addition polymerization catalyst activatable by actinic light, must be compatible with both the other two necessary components, as well as any other added organic or inorganic fillers or the like, and is preferably soluble in the low molecular weight polymerizable component. In any event, it must be capable of being substantially homogeneously dispersed through the compositions. In the second place, since most conventional light sources give off both heat and light and since the former is transmitttd by the opaque and transparent areas of the image-bearing process transparencies used in the process, the free radical generating, addition polymerization initiators should not be activatable thermally below about 85° C. This is also important since the polymerization itself generates heat, some of which is transmitted to areas of the compositions outside the exposed areas. In order to preserve ultimate fidelity of the printing image, such transmitted heat should not be permitted to initiate polymerization in the unexposed areas. Steps can be taken to exclude to some extent the heat rays emanating from the light source and to remove heat buildup caused by polymerization, so as to maintain the photopolymerizable layer at temperatures which are not effective in activating the initiator thermally but these are troublesome. Furthermore, complete exclusion of input or generated heat makes necessary longer exposure times since the rate of chain propagation in the polymerization reaction is lower at reduced temperatures.

Thus, the free radical generating addition polymerization initiators which must be used in these new compositions are those capable of initiating polymerization under the influence of actinic light which are dispersible in the aforesaid described water-soluble cellulose derivative/lower molecular weight polymerizable component compositions to the extent necessary for initiating the desired polymerization under the influence of the light energy available and which are not active thermally at temperatures below 80–85° C. The preferred initiators are obviously those which are most rapidly affected by the light energy available in the shortest exposure times to initiate the greatest number of growing polymer chains. These photopolymerization initiators are used in amounts of from 0.01% to 5.0%, and preferably from 0.1–2.0%, based on the weight of the polymerizable component. Suitable such initiators include vicinal ketaldonyl compounds, e.g., diacetyl, benzil, etc.;
α-ketaldonyl alcohols, e.g., benzoin and pivaloin;
acyloin ethers, e.g., benzoin methyl or ethyl ethers;
α-hydrocarbon-substituted aromatic acyloins, including α-methylbenzoin, α-allylbenzoin, and α-phenylbenzoin.

The acyloin ethers are especially useful.

The commercial low molecular weight polymerizable components discussed previously, including both the mono- and polyethylenically unsaturated compounds, will normally contain minor amounts (about 50–100 parts per million by weight) of polymerization inhibitors so as to prevent spontaneous polymerization before desired. The presence of these inhibitors, which are usually of the antioxidant type, e.g., hydroquinone, tertiary butyl catechols, and the like in such amounts causes no undesirable results in the photopolymerizable layers of this invention either as to speed or quality of polymerization. In fact, larger quantities of such inhibitors, e.g., of the order of 200–500 parts per million can be tolerated and tend to reduce unwanted polymerization in non-exposed, i.e., non-image, areas.

The photopolymerizable compositions of this invention are also suitable for other purposes in which readily insolubilized, solid, addition polymerizable compositions are useful, such as in binders for television phosphors, in introducing ornamental effects, and in plastic articles of various types. They are useful in making multicolored screens by the photopolymerization procedures described in the copending application of Swindells U.S. application Ser. No. 373,753, filed August 12, 1953. Development, i.e., preferential dissolution of the exposed areas of the photopolymerizable compositions obtained by any of the foregoing controlled exposure techniques, will normally be carried out in water alone, generally at temperatures of 25–50° C. Higher temperatures, e.g., of the order of 50–60° C. or so result in rapid development. Development is frequently accelerated by brushing or scrubbing. In large scale work, application of the water solvent will advantageously be carried out by means of jets or sprays. In some instances, depending on the aqueous/organic partition solution coefficient for the water-soluble cellulose component, it may frequently be helpful to use minor quantities of organic solvents, such as the short chain aliphatic alcohols, short chain aliphatic and cyclo-aliphatic ketones, as well as the low molecular weight halogenated hydrocarbons. Suitable specific organic solvents include methanol, ethanol, acetone, methylene chloride, and mixtures of such solvents, generally in amounts no greater than 25–35%, preferably less than about 1–5% of the water developer.

The printing reliefs made in accordance with this invention can be used in all classes of printing, but are most applicable to those classes wherein a distinct difference in height between printing and non-printing areas is required. These classes include: those wherein the ink is carried by the raised portion of the relief, such as in dry offset printing; ordinary letterpress (the latter requiring greater height differences between printing and non-printing areas); and those wherein the ink is carried by the recessed portions of the relief, such as in intaglio printing, e.g., line and inverted halftone. The plates are obviously useful for multicolor printing. This invention also includes photopolymerizable elements suitable for the preparation of printing relief images as above which comprise layers of the composition of this invention superposed on an adherent support, said layer being from 3 to 250 mils in thickness, all as described in greater detail in the copending application of Plambeck, Ser. No. 326,841, filed Dec. 19, 1952 (U.S. Patent 2,760,863).

What is claimed is:

1. A photopolymerizable composition comprising (1) an addition polymerization initiator activatable by actinic light, (2) a normally non-gaseous, addition polymerizable, ethylenically unsaturated compound having a normal boiling point above 100° C. at atmospheric pressure, having a molecular weight from about 100 to about 1500, containing at least one addition polymerizable ethylenic linkage for about 300 units of molecular weight, and being capable of forming a high polymer by photoinitiated polymerization in the presence of an addition polymerization initiator therefor activatable by actinic light, and (3) a cellulose derivative taken from the class consisting of cellulose alkyl ethers and cellulose esters of saturated aliphatic monocarboxylic acids and cellulose mixed ethers and esters of the named types having at least 50 combined glucose units as recurring units in the molecule, the alkyl ether groups and ester groups containing not more than 4 carbon atoms, the cellulose derivative having a degree of substitution from 0.5 to 2.6 and being soluble in water at 25° C. to the extent of at least 2% by weight, said unsaturated compound being present in an amount from 10 to 60% and said derivative being present in an amount from 90 to 40% by weight of the composition and said initiator being present in an amount from 0.01% to 5% by weight of said compound.

2. A composition as set forth in claim 1 wherein said composition contains up to 40% by weight of a compatible filler material essentially transparent in the composition.

3. A composition as set forth in claim 1 wherein the substituents on the cellulose molecule are present in an amount from 10 to 17% by weight exclusive of the linking oxygen atom.

4. A photopolymerizable element comprising (*a*) a support, and (*b*) a relief height-forming layer comprising (1) an addition polymerization initiator activatable by actinic light and thermally inactive at temperatures below 85° C., (2) a normally non-gaseous, addition polymerizable, ethylenically unsaturated compound having a normal boiling point above 100° C. at atmospheric pressure, having a molecular weight from about 100 to about 1500, containing at least one addition polymerizable ethylenic linkage for about 300 units of molecular weight, and being capable of forming a high polymer by photoinitiated polymerization in the presence of an addition polymerization initiator therefor activatable by actinic light, and (3) a cellulose derivative taken from the class consisting of cellulose alkyl ethers and cellulose esters of saturated aliphatic monocarboxylic acids and cellulose mixed ethers and esters of the named types having at least 50 combined glucose units as recurring units in the molecule, the alkyl ether groups and ester groups containing not more than 4 carbon atoms, the cellulose derivative having a degree of substitution from 0.5 to 2.6 and being soluble in water at 25° C. to the extent of at least 2% by weight, said unsaturated compound being present in an amount from 90 to 40% by weight of the composition and said initiator being present in an amount from 0.01% to 5% by weight of said compound, and said relief height-forming layer having an optical density less than 5 and less than 0.5 per mil to said actinic light.

5. A photopolymerizable element as set forth in claim 4 wherein said layer is 3 to 250 mils in thickness.

6. A photopolymerizable element as set forth in claim 5 wherein said base is a metal and there is a stratum of antihalation material beneath said layer.

7. A photopolymerizable element as set forth in claim 5 wherein said layer contains compatible filler material in an amount up to 40% by weight.

8. A photopolymerizable element as set forth in claim 5 wherein the substituents on the cellulose molecule are present in an amount from 10 to 17% by weight exclusive of the linking oxygen atom.

9. The process of making a relief which comprises exposing to actinic light selected areas of a photopolymerizable element as set forth in claim 5 until substantial polymerization to the insoluble state takes place in the exposed areas without significant polymerization in the unexposed areas and removing the unexposed portions of said layer by means of a predominantly aqueous solution.

References Cited in the file of this patent

UNITED STATES PATENTS

| | | |
|---|---|---|
| 2,336,985 | Freund | Dec. 14, 1943 |
| 2,692,826 | Neugebauer | Oct. 26, 1954 |
| 2,719,132 | Schweitzer | Sept. 27, 1955 |
| 2,791,504 | Plambeck | Aug. 28, 1956 |
| 2,789,053 | Elliott | Apr. 16, 1957 |

OTHER REFERENCES

Anderson et al.: Abstract of application Serial No. 671,395, pub. April 11, 1950, 1 page.